United States Patent
Yoo et al.

(10) Patent No.: US 10,103,301 B2
(45) Date of Patent: Oct. 16, 2018

(54) SEMICONDUCTOR LIGHT EMITTING DEVICE

(71) Applicant: Samsung Electronics Co., Ltd., Suwon-si, Gyeonggi-do (KR)

(72) Inventors: Hanul Yoo, Bucheon-si (KR); Yong Il Kim, Seoul (KR); Sung Hyun Sim, Uiwang-si (KR); Wan Tae Lim, Suwon-si (KR); Hye Seok Noh, Suwon-si (KR); Ji Hye Yeon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/617,669

(22) Filed: Jun. 8, 2017

(65) Prior Publication Data

US 2018/0175261 A1 Jun. 21, 2018

(30) Foreign Application Priority Data

Dec. 16, 2016 (KR) ........................ 10-2016-0173025

(51) Int. Cl.
*H01L 33/58* (2010.01)
*H01L 33/06* (2010.01)
(Continued)

(52) U.S. Cl.
CPC ............ *H01L 33/58* (2013.01); *H01L 33/007* (2013.01); *H01L 33/0079* (2013.01); *H01L 33/06* (2013.01); *H01L 33/12* (2013.01); *H01L 33/22* (2013.01); *H01L 33/32* (2013.01); *H01L 33/405* (2013.01); *H01L 33/502* (2013.01); *F21K 9/232* (2016.08); *F21K 9/235* (2016.08); *F21K 9/238* (2016.08); *F21V 29/76* (2015.01);
(Continued)

(58) Field of Classification Search
CPC ...... H01L 33/405; H01L 33/502; H01L 33/06
See application file for complete search history.

(56) References Cited

U.S. PATENT DOCUMENTS 6,372,608 B1   4/2002 Shimoda et al.
6,645,830 B2   11/2003 Shimoda et al.
(Continued)

FOREIGN PATENT DOCUMENTS

KR   20150130022 A   11/2015
KR   20160053255 A   5/2016

*Primary Examiner* — Julia Slutsker
(74) *Attorney, Agent, or Firm* — Harness, Dickey & Pierce, P.L.C.

(57) ABSTRACT

A semiconductor light emitting device includes a light-transmissive support having a first surface including a first region and a second region surrounding the first region, and a second surface opposing the first surface, and including a wavelength conversion material, a semiconductor stack disposed above the first region of the first surface of the light-transmissive support, and including first and second conductivity-type semiconductor layers and an active layer disposed therebetween, a light-transmitting bonding layer disposed between the light-transmissive support and the semiconductor stack, a light blocking film disposed above the second region of the light-transmissive support to surround the semiconductor stack, and first and second electrodes respectively disposed on portions of the first and second conductivity-type semiconductor layers.

15 Claims, 18 Drawing Sheets

(51) Int. Cl.
   *H01L 33/32* (2010.01)
   *H01L 33/22* (2010.01)
   *H01L 33/12* (2010.01)
   *H01L 33/50* (2010.01)
   *H01L 33/40* (2010.01)
   *H01L 33/00* (2010.01)
   *F21K 9/235* (2016.01)
   *F21V 29/76* (2015.01)
   *F21K 9/238* (2016.01)
   *F21K 9/232* (2016.01)

(52) U.S. Cl.
   CPC ............... *H01L 2933/0016* (2013.01); *H01L 2933/0041* (2013.01); *H01L 2933/0058* (2013.01)

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sheffer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,142,744 B2 | 9/2015 | Tomizawa et al. |
| 9,450,151 B2 | 9/2016 | Choi et al. |
| 2015/0069437 A1* | 3/2015 | Tomizawa | H01L 33/54 257/98 |
| 2016/0161650 A1* | 6/2016 | Taraschi | G02B 5/28 349/70 |
| 2016/0197229 A1* | 7/2016 | Park, II | H01L 33/0079 438/27 |
| 2016/0276325 A1 | 9/2016 | Nair et al. |
| 2017/0051884 A1* | 2/2017 | Raring | H01S 5/02236 |

\* cited by examiner

SEMICONDUCTOR LIGHT EMITTING DEVICE

CROSS-REFERENCE TO RELATED APPLICATION(S)

This application claims the benefit of priority from Korean Patent Application No. 10-2016-0173025 filed on Dec. 16, 2016 in the Korean Intellectual Property Office, the disclosure of which is incorporated herein by reference in its entirety.

BACKGROUND

1. Field

The example inventive concepts relate to a semiconductor light emitting device.

2. Description of Related Art

In general, semiconductor light emitting diodes (LEDs) have been widely used as light sources, due to possessing many positive attributes such as low power consumption, a high degree of brightness, and the like. Thus, semiconductor light emitting devices have been employed in the backlight units of displays, such as large liquid crystal displays (LCDs), as well as various other types of lighting devices.

Substrates (hereinafter, referred to as growth substrates) used for epitaxial growth in the manufacturing process of semiconductor light emitting devices, may at times have to be removed because of electrical connection or optical loss issues. In this case, other means may be advantageous to support epitaxial thin films.

SUMMARY

Some example embodiments relate to a semiconductor light emitting device in which light extraction efficiency may be improved, while introducing a wavelength conversion structure in a flip chip structure.

According to an example embodiment, a semiconductor light emitting device includes a light-transmissive support having a first surface including a first region and a second region surrounding the first region, and a second surface opposing the first surface, and including a wavelength conversion material, a semiconductor stack disposed on the first region of the first surface of the light-transmissive support, and including first and second conductivity-type semiconductor layers and an active layer disposed between the first and second conductivity-type semiconductor layers, a light-transmitting bonding layer disposed between the light-transmissive support and the semiconductor stack, a light blocking film disposed on the second region of the light-transmissive support to surround or encompass the semiconductor stack, and first and second electrodes respectively disposed on a portion of the first conductivity-type semiconductor layer and a portion of the second conductivity-type semiconductor layer.

According to an example embodiment, a semiconductor light emitting device includes a light-transmissive support having a first surface including a first region and a second region surrounding the first region, and a second surface opposing the first surface, the light-transmissive support being formed of, or including, a bonding material containing a wavelength conversion material, a semiconductor stack bonded to the first region of the first surface of the light-transmissive support, and including first and second conductivity-type semiconductor layers and an active layer disposed between the first and second conductivity-type semiconductor layers, a light blocking film disposed on the second region of the light-transmissive support to surround the semiconductor stack, and first and second electrodes respectively disposed on a portion of the first conductivity-type semiconductor layer and a portion of the second conductivity-type semiconductor layer.

In some example embodiments, a semiconductor light emitting device includes a light-transmissive substrate including a wavelength conversion material, a semiconductor stack on the light-transmissive substrate, a light-transmitting bonding layer configured to bond the light-transmissive substrate with the semiconductor stack, and a light blocking film on the light-transmissive substrate and encompassing the semiconductor stack.

BRIEF DESCRIPTION OF DRAWINGS

The above and other example embodiments, features and other advantages of the example inventive concepts will be more clearly understood from the following detailed description taken in conjunction with the accompanying drawings, in which.

DETAILED DESCRIPTION

Hereinafter, various example embodiments will now be described in detail with reference to the accompanying drawings.

Figure 1A:
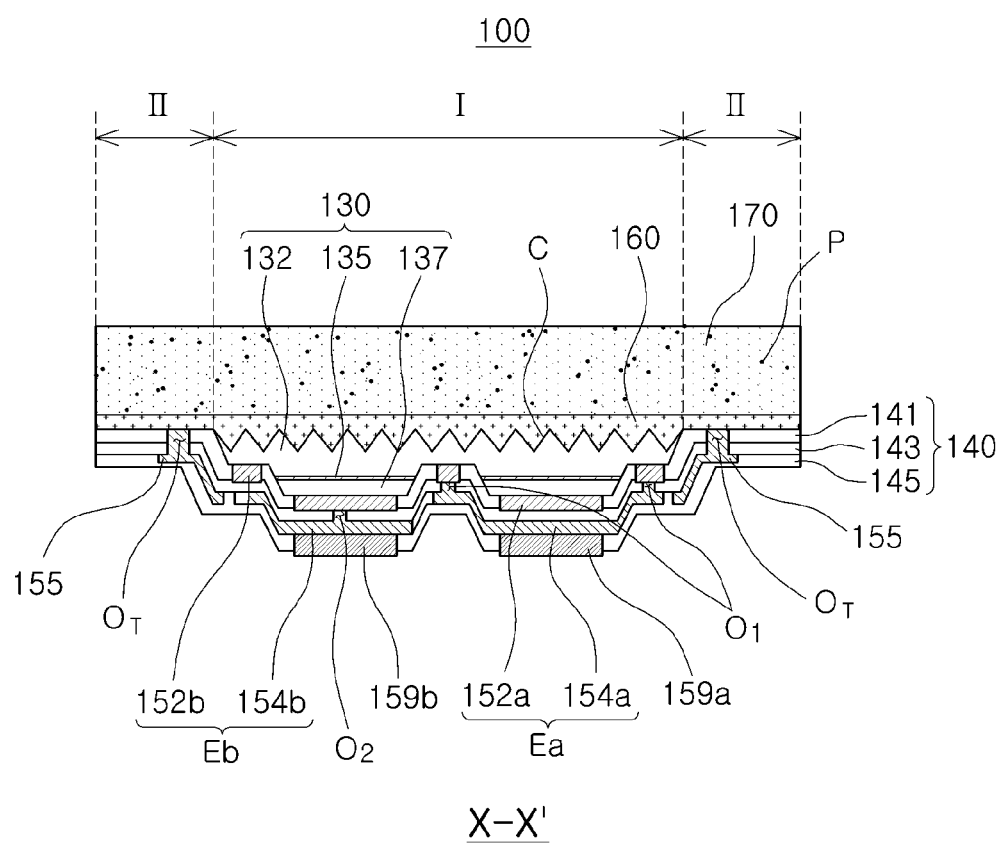
FIGS. 1A and 1B respectively illustrate a cross-sectional view and a plan view of a semiconductor light emitting device, according to an example embodiment.
Figure 1B:
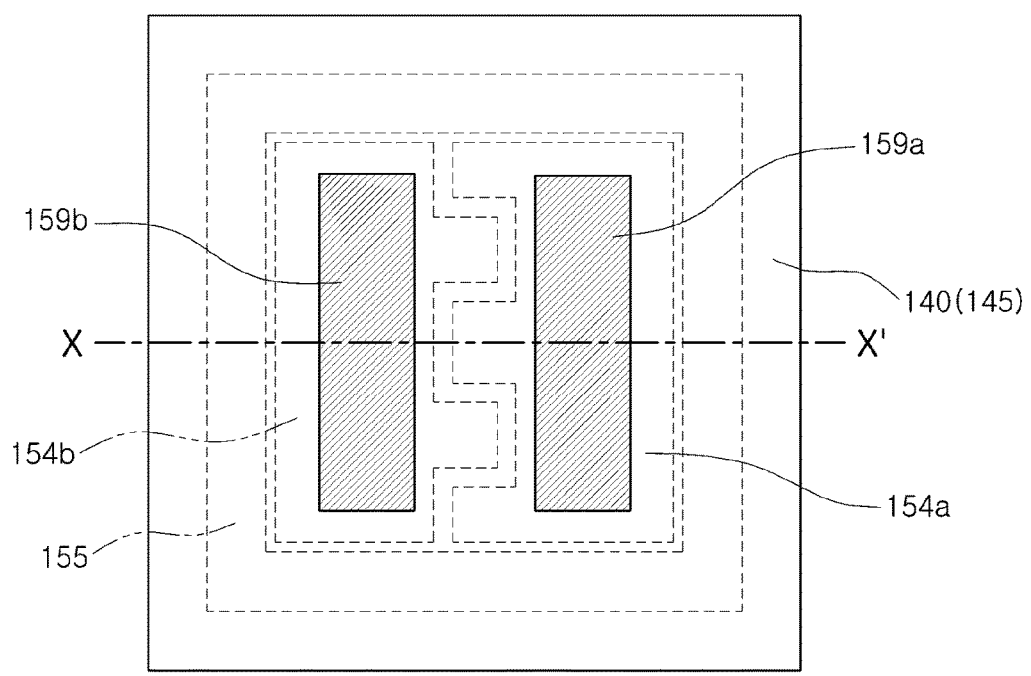

FIGS. 1A and 1B respectively illustrate a cross-sectional view and a plan view of a semiconductor light emitting device, according to an example embodiment.

With reference to FIG. 1A, a semiconductor light emitting device 100 according to an example embodiment may include a semiconductor stack 130, a light-transmissive support or substrate 170 supporting the semiconductor stack 130, and a light-transmitting bonding layer 160 bonding the semiconductor stack 130 and the light-transmissive support 170 to each other.

In the example embodiment, one surface of the light-transmissive support 170 may include a first region I and a second region II surrounding the first region I, and the semiconductor stack 130 may be formed in the first region I of one surface of the light-transmissive support 170.

The semiconductor stack 130 may include a first conductivity-type semiconductor layer 132, a second conductivity-type semiconductor layer 137, and an active layer 135 interposed therebetween. The first and second conductivity-type semiconductor layers 132 and 137 and the active layer 135 may be provided as nitride semiconductors. The first conductivity-type semiconductor layer 132 may be an n-type nitride semiconductor layer $Al_xIn_yGa_{1-x-y}N$ ($0 \leq x \leq 1$, $0 \leq y \leq 1$, $0 \leq x+y \leq 1$), and an n-type impurity may be silicon (Si). For example, the first conductivity-type semiconductor layer 132 may be formed of or include n-type GaN. The second conductivity-type semiconductor layer 137 may be a p-type nitride semiconductor layer $Al_xIn_yGa_{1-x-y}N$, and a p-type impurity may be magnesium (Mg). For example, the second conductivity-type semiconductor layer 137 may be formed of or include p-type AlGaN/GaN. The active layer 135 may have a multiple quantum well (MQW) structure in which a quantum well layer and a quantum barrier layer may be stacked, for example alternately stacked. For example, when a nitride semiconductor may be used, the active layer 135 may have a GaN/InGaN MQW structure. The semiconductor stack 130 may have first and second surfaces provided by the first and second conductivity-type semiconductor layers 132 and 137, respectively.

The first surface of the semiconductor stack 130 may be provided with concave-convex portions C allowing for improved light extraction efficiency. In the example embodiment, the concave-convex portions C may be protrusions having a longitudinal triangular cross section, for example, having a hexagonal pyramid shape, but may have various other shapes. The concave-convex portions C may be formed by processing a surface of the first conductivity-type semiconductor layer 132. In a manner different from the example embodiment, a buffer layer 110 (see FIG. 2A) used when growing the semiconductor stack 130 may be formed as at least portions of the concave-convex portions C.

The light-transmissive support 170 disposed on the first surface of the semiconductor stack 130 may be provided as a main path through which light generated in the active layer 135 may be emitted. The light-transmissive support 170 may be provided as a support substrate replacing a growth substrate used for growing the semiconductor stack 130.

In an example embodiment, the light-transmissive support 170 may include a glass substrate including a wavelength conversion material (P). In another example embodiment, the light-transmissive support 170 may include a ceramic substrate formed of or include a phosphor. A thickness of the light-transmissive support 170 may be at least 100 μm.

The light-transmissive support 170 may be bonded to the first surface of the semiconductor stack 130 using a light-transmitting bonding layer 160. For example, as a material of the light-transmitting bonding layer 160, spin-on-glass may be used as well as an adhesive polymer material. The adhesive polymer may include a material selected from silicone, epoxy, polyacrylate, polyimide, polyamide, and benzocyclobutene (BCB). The light-transmitting bonding layer 160 may be a layer to match refractive indexes between the light-transmissive support 170 and the semiconductor stack 130 to each other. A refractive index of the light-transmitting bonding layer 160 may be a refractive index between a refractive index of the light-transmissive support 170 and a refractive index of the first conductivity-type semiconductor layer 132.

The light-transmitting bonding layer 160 in the example embodiment may include an additional wavelength conversion material such as a phosphor. For example, the wavelength conversion material P of the light-transmissive support 170 may be a first wavelength conversion material converting a portion of light generated in the active layer 135 into light of a first wavelength, and the additional wavelength conversion material of the light-transmitting bonding layer 160 may be a second wavelength conversion material converting a portion of light generated in the active layer 135 into light of a second wavelength, different from the first wavelength. In an example embodiment, the first wavelength may be shorter than the second wavelength, and the first and second wavelength conversion materials may be configured in such a manner that light may ultimately be emitted as white light. For example, the wavelength conversion material (P) may be a green or yellow phosphor, and the additional wavelength conversion material may be a red phosphor.

As described above, in the example embodiment, an additional process of forming a structure for wavelength conversion may be omitted or simplified.

The semiconductor light emitting device 100 may include first and second electrodes Ea and Eb connected to portions of the first and second conductivity-type semiconductor layers, respectively.

The second conductivity-type semiconductor layer 137 and the active layer 135 may be mesa-etched to expose a portion of the first conductivity-type semiconductor layer 132. The exposed portion of the first conductivity-type semiconductor layer 132 may be provided as a contact region for the first electrode Ea. The exposed region of the first conductivity-type semiconductor layer 132 may have a hole shape or may be a lengthwise-extended linear shape having a circular or polygonal shape when viewed from a plane. In the example embodiment, the contact region of the first conductivity-type semiconductor layer 132 may have a form in which a quadrangular hole located in a central portion and a linear type region thereof surrounding a mesa region are provided. The second electrode Eb may be disposed on an upper surface of the second conductivity-type semiconductor layer 137.

The first and second electrodes Ea and Eb may further include first and second ohmic contact layers 152a and 152b and first and second connection electrode layers 154a and 154b, respectively.

The first and second ohmic contact layers 152a and 152b may include a high reflective ohmic contact material having relatively high reflectivity while forming an ohmic contact with the first and second conductivity-type semiconductor layers 132 and 137. For example, the first and second ohmic contact layers 152a and 152b may include Ag or Ag/Ni. The first and second connection electrode layers 154a and 154b may include a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like, and may have a structure of a single layer or two or more layers.

The semiconductor stack 130 may include an insulating layer 140 defining a contact region for electrode formation. In the example embodiment, the insulating layer 140 may include first, second and third insulating layers 141, 143 and 145. The first insulating layer 141 may be formed to expose the first and second ohmic contact layers 152a and 152b, and the second insulating layer 143 may include first and second openings O1 and O2 (see FIGS. 3D and 3E) defining regions connecting the first and second ohmic contact layers 152a and 152b to the first and second connection electrode layers 154a and 154b, respectively.

The first and second connection electrode layers 154a and 154b may be formed side by side via the arrangement of the first and second openings O1 and O2 as illustrated in FIG. 1B. The first connection electrode layer 154a may be disposed on one side of a mesa region to be connected to the first ohmic contact layer 152a through the first opening O1, and the second connection electrode layer 154b may be disposed on the other side of the mesa region to be connected to the second ohmic contact layer 152b through the second opening O2. First and second electrode pads 159a and 159b may also be formed on the first and second connection electrode layers 154a and 154b, respectively. The third insulating layer 145 may be formed as a final passivation layer.

The insulating layer 140 including the first and second insulating layers 141 and 143 may be formed to extend above the second region II of one surface of the light-transmissive support 170, as well as on a surface of the semiconductor stack 130.

As illustrated in FIG. 1B, the light blocking film 155 may be disposed to surround the semiconductor stack 130. The light blocking film 155 may extend from a light blocking opening (or a third opening) $O_T$ of the first and second insulating layers 141 and 143 along a surface of the second insulating layer 143, to cover a side of the semiconductor stack 130. The light blocking opening $O_T$ may be formed in the vicinity of the semiconductor stack 130 to penetrate through the first and second insulating films 141 and 143. The light blocking opening $O_T$ may be formed together with the formation of the first and second openings O1 and O2. The light blocking opening $O_T$ may be located on the light-transmissive support 170, above which the semiconductor stack 130 is not formed. For example, the light blocking film 155 may be formed of or include a material such as a reflective metal or a black epoxy mold compound (EMC). In the example embodiment, the light blocking film 155 may include the same material as a material of a portion of the first and second electrodes Ea and Eb, for example, the first and second connection electrode layers 154a and 154b.

The light blocking film 155 may be configured to guide light generated in the active layer 135 to be effectively emitted through the light-transmissive support 170, thereby improving light efficiency of the semiconductor light emitting device 100.

Hereinafter, a method of manufacturing a semiconductor light emitting device according to an example embodiment will be described. The method of manufacturing a semiconductor light emitting device according to an example embodiment may be broadly classified into a device manufacturing process (see FIGS. 2A to 2G) and a substrate replacement process (see FIGS. 4A to 4F).

Figure 2A:
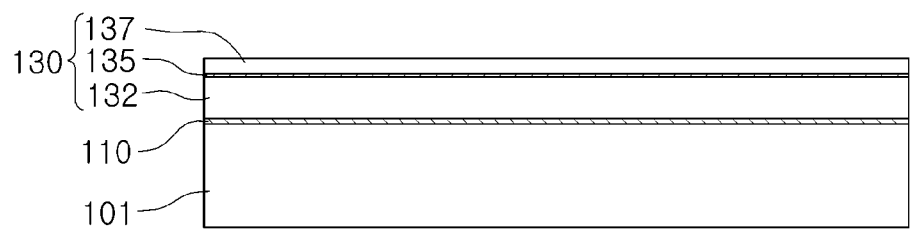
FIGS. 2A to 2G are cross-sectional views illustrating example processes in a method of manufacturing a semiconductor light emitting device, for example, forming a light blocking film, according to an example embodiment.

FIGS. 2A to 2G are cross-sectional views illustrating main processes in a method of manufacturing a semiconductor light emitting device according to an example embodiment, and FIGS. 3A to 3F are plan views illustrating a portion of main processes. Referring to FIG. 2A, a buffer layer 110 may be formed on a growth substrate 101, and a semiconductor stack 130 for a light emitting device may be formed on the buffer layer 110. The semiconductor stack 130 may include a first conductivity-type semiconductor layer 132, an active layer 135, and a second conductivity-type semiconductor layer 137.

The buffer layer 110 may be an $In_xAl_yGa_{1-x-y}N$ (0≤x≤1, 0≤y≤1) layer. For example, the buffer layer 110 may be an AlN, AlGaN, or InGaN layer. The buffer layer 110 may be formed by combining a plurality of layers or by gradually changing a composition thereof. For example, when the growth substrate is a silicon substrate and a nitride semiconductor is grown as the semiconductor stack 130, the buffer layer 110 may have various-types of composite buffer structures, which will be described with reference to FIGS. 6A to 6D.

Respective layers of the semiconductor stack 130 may be the nitride semiconductor described in the foregoing example embodiment, and may be grown on the growth substrate 101 using a process such as metal-organic chemical vapor deposition (MOCVD), molecular beam epitaxy (MBE), or hydride vapor phase epitaxy (HVPE).

Figure 2B:
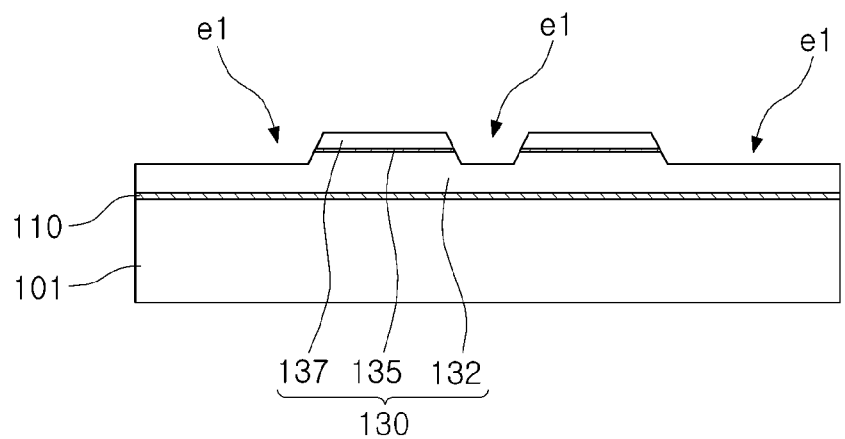
Figure 3A:
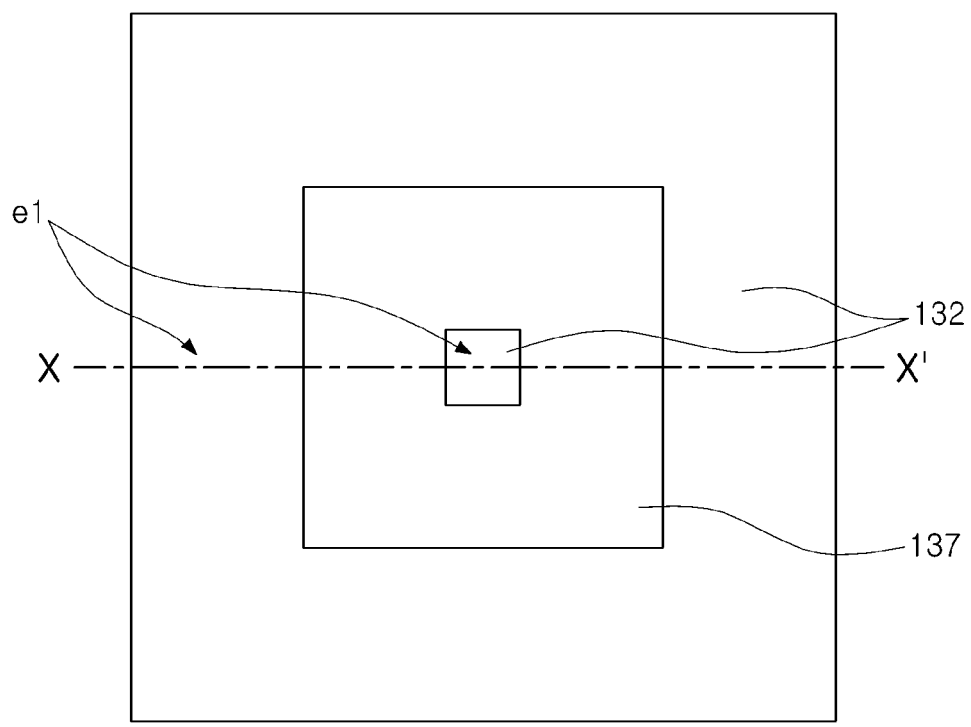
FIGS. 3A to 3F are plan views illustrating example processes in a method of manufacturing a semiconductor light emitting device, according to an example embodiment.

Referring to FIGS. 2B and 3A, in the case of the semiconductor stack 130, portions e1 of the first conductivity-type semiconductor layer 132 may be exposed.

The process in which the first conductivity-type semiconductor layer 132 is exposed may be implemented by an etching process of removing portions of the second conductivity-type semiconductor layer 137 and the active layer 135. The exposed regions e1 of the first conductivity-type semiconductor layer 132 may be provided as contact regions for a first electrode.

In the example embodiment, the exposed regions e1 of the first conductivity-type semiconductor layer 132 may be formed to have a quadrangular hole located in a central portion and a line type surrounding a mesa region, as illustrated in FIG. 3A. The mesa region, represented by the second conductivity-type semiconductor layer 137, may have a square or rectangular shape.

Figure 2C:
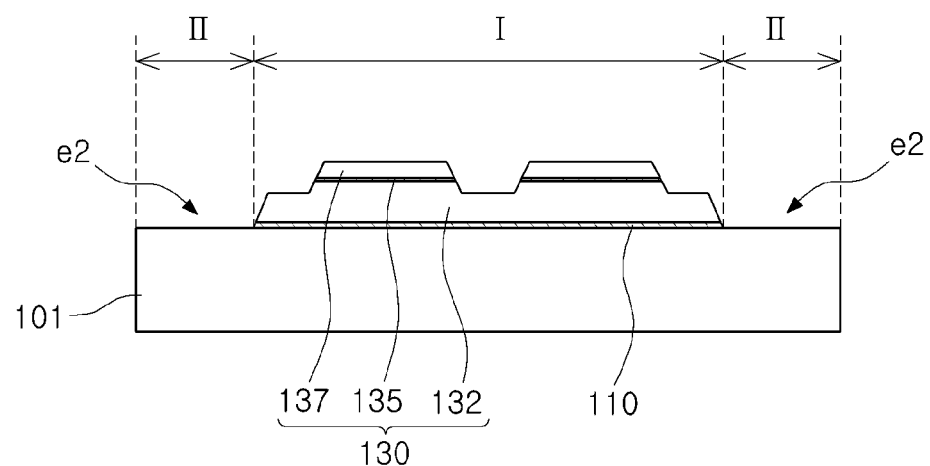
Figure 3B:
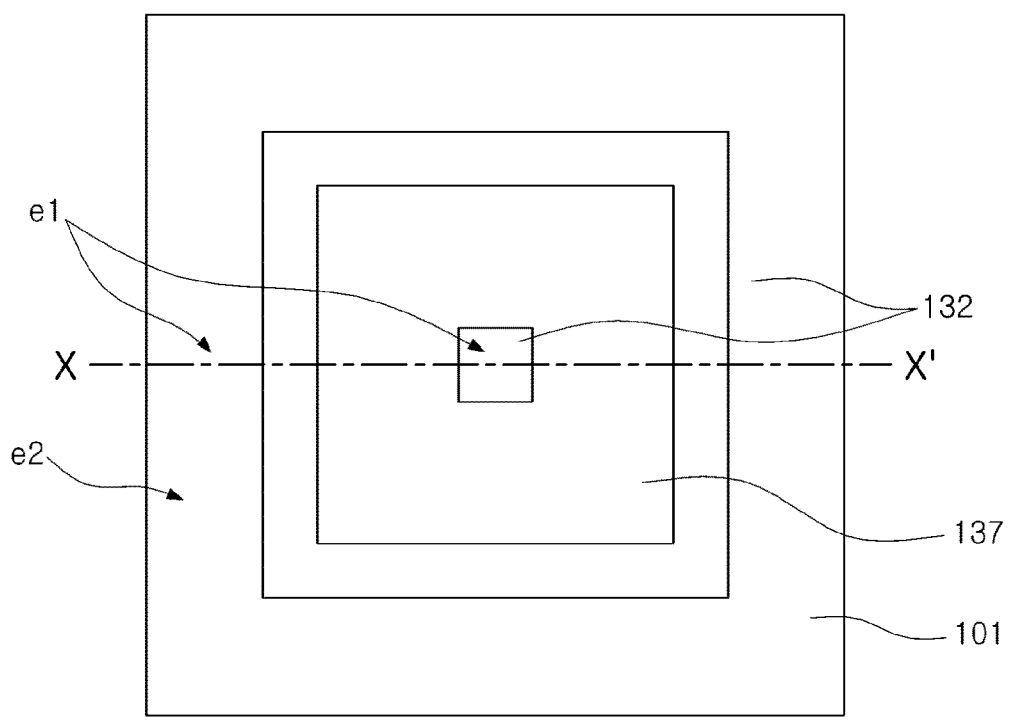

Subsequently, as illustrated in FIGS. 2C and 3B, the growth substrate 101 may be exposed by removing a peripheral region of the semiconductor stack 130.

In the process of exposing the growth substrate 101, an exposed region e2 of the growth substrate 101 surrounding the semiconductor stack 130 may be provided by additionally removing an outer circumferential region from a mesa-etched region as described above. The semiconductor stack 130 may remain in the first region I and the growth substrate 101 may be exposed in the second region II surrounding the first region I as illustrated in FIG. 3B.

Then, first and second electrodes Ea and Eb connected to a portion of the first conductivity-type semiconductor layer 132 and a portion of the second conductivity-type semiconductor layer 137, respectively, may be formed. In the example embodiment, an electrode forming process may be implemented by processes of FIGS. 2D to 2H.

Figure 2D:
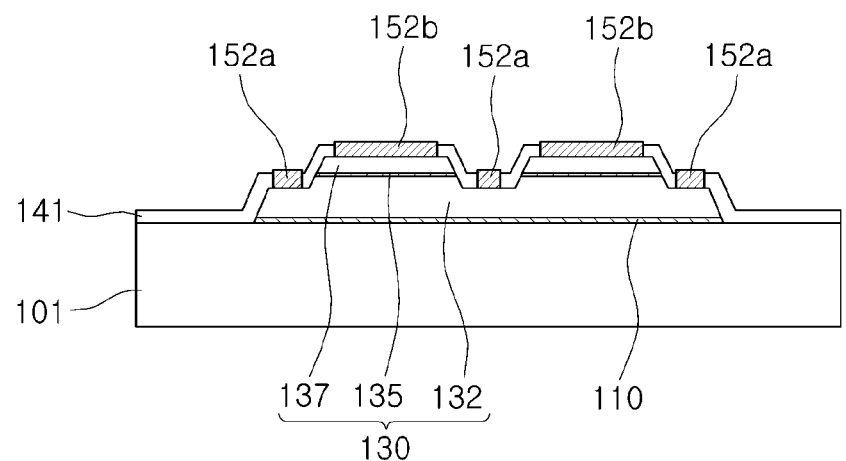
Figure 3C:
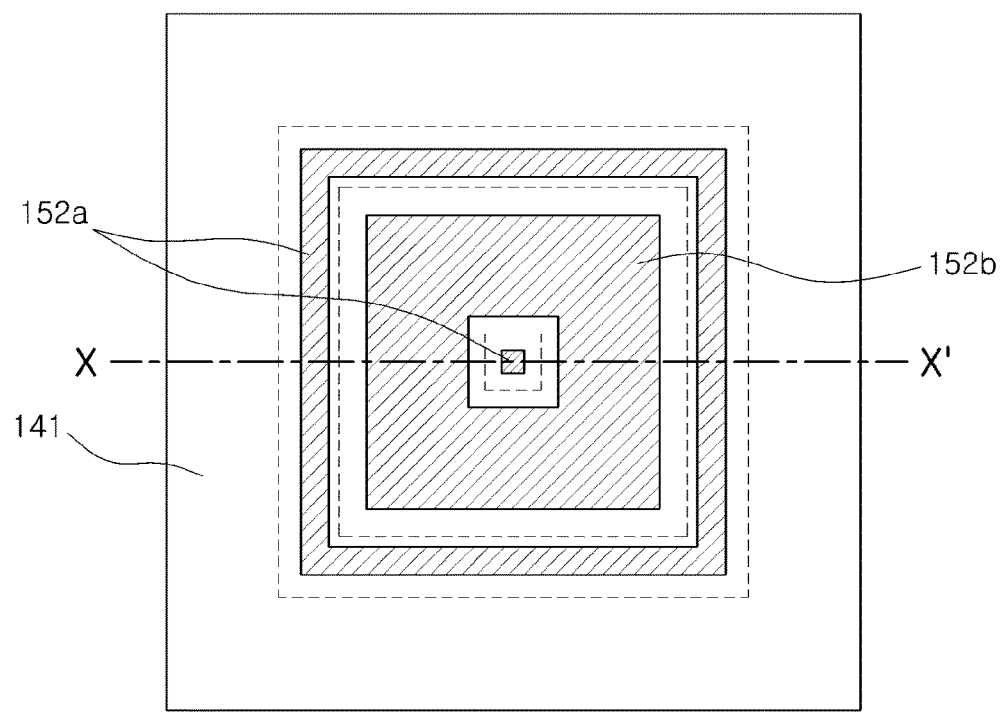

First, as illustrated in FIGS. 2D and 3C, first and second ohmic contact layers 152a and 152b may be formed on an upper surface of the second conductivity-type semiconductor layer 137.

The process of forming the first and second ohmic contact layers 152a and 152b may be implemented by exposing regions in which the first and second ohmic contact layers 152a and 152b are to be formed using a mask after a first insulating layer 141 is formed on the entirety of an upper surface of the semiconductor stack 130, and by depositing the first and second ohmic contact layers 152a and 152b on the exposed regions. For example, the first insulating layer 141 may be a $SiO_2$, $Si_3N_4$, $HfO_2$, SiON, $TiO_2$, $Ta_2O_3$ or $SnO_2$ layer. As described above, the first insulating layer 141 may also be formed on the second region II of the growth substrate 101. In another example, the first insulating layer 141 may be a distributed Bragg reflector (DBR) multilayer film in which dielectric films having different refractive indices are stacked, for example alternately stacked.

As illustrated in FIG. 3C, the second ohmic contact layer 152b may be disposed on an upper surface of the second conductivity-type semiconductor layer 137, an upper end portion of a mesa structure, and the first ohmic contact layer 152a may be respectively formed on a region surrounded by the mesa structure and on a region surrounding the mesa structure. The first and second ohmic contact layers 152a and 152b may include a high reflective ohmic contact material having relatively high reflectivity while forming an ohmic contact with the second conductivity-type semiconductor layer 137. For example, the first and second ohmic contact layers 152a and 152b may include silver (Ag) or silver/nickel (Ag/Ni).

Figure 2E:
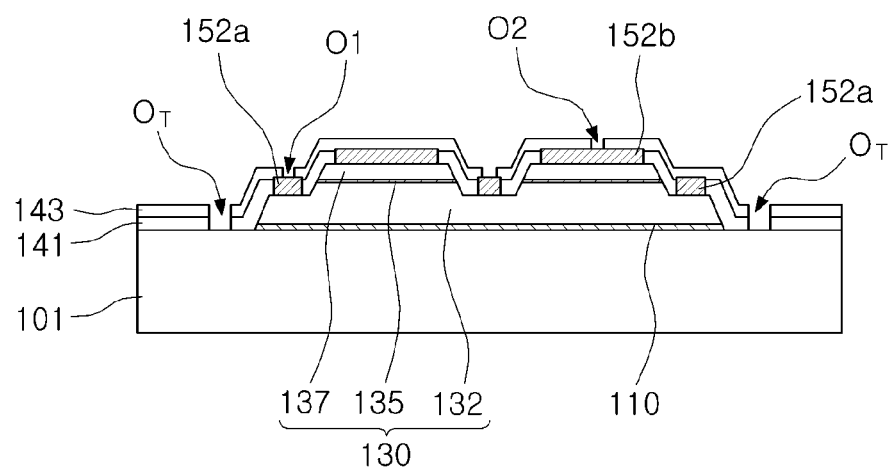
Figure 3D:
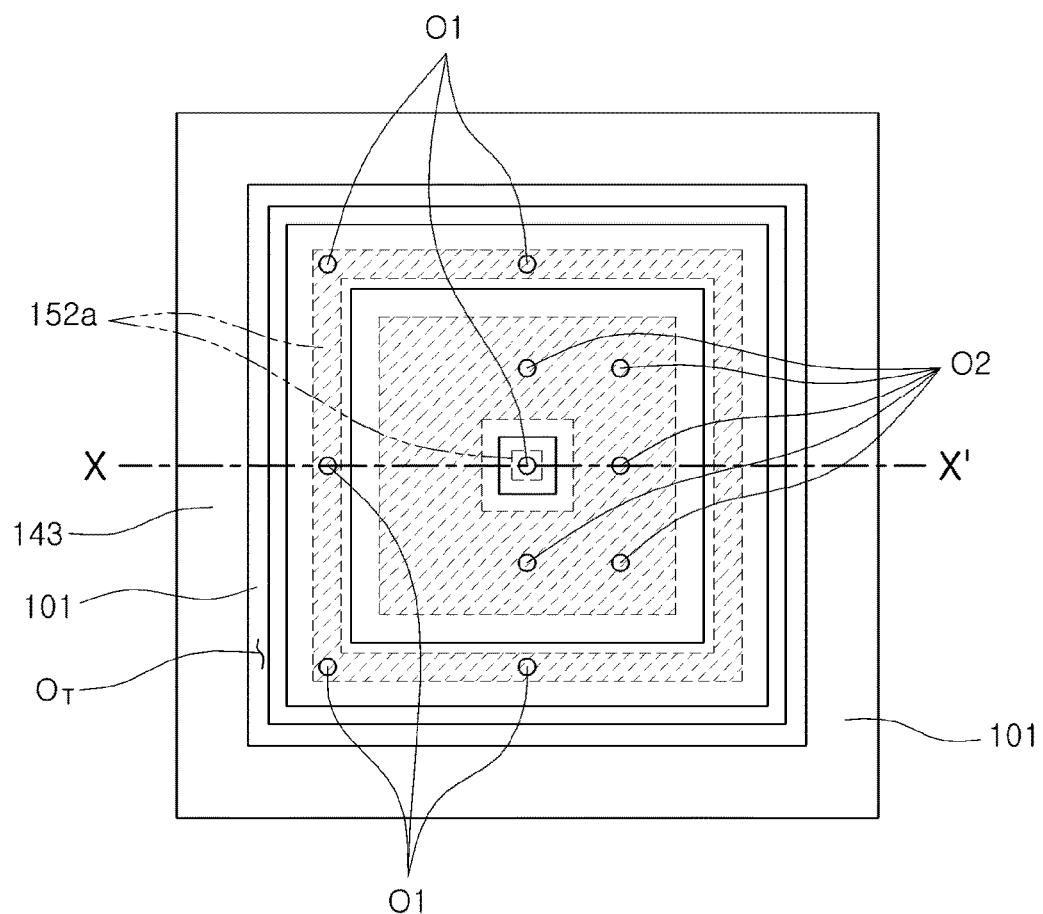

Next, as illustrated in FIGS. 2E and 3D, a second insulating layer 143 having first and second openings O1 and O2 may be formed on an upper surface of the semiconductor stack 130, and a light blocking opening $O_T$ penetrating through the first and second insulating layers 141 and 143 may further be formed.

The first and second openings O1 and O2 may be formed to expose a portion of the first ohmic contact layer 152a and a portion of the second ohmic contact layer 152b, respectively. The light blocking opening $O_T$ may be formed together with the formation of the first and second openings O1 and O2. For example, after an insulating material is formed on the entirety of an upper surface of the growth substrate 101, including the second region II, the second insulating film 143 having the first and second openings O1 and O2 and the light blocking opening $O_T$ may be formed using a mask.

In order to simplify the arrangement of subsequent electrodes, the first and second openings O1 and O2 may be disposed to be separated from each other on both sides as illustrated in FIG. 3D. In the example embodiment, the first openings O1 may be arranged on the left and in central regions to be connected to the first ohmic contact layer 152a and may be arranged as six openings, in a vertical symmetrical direction, and the second openings O2 may be arranged on the right and in central regions to be connected to the second ohmic contact layer 152b and may be arranged as five openings, in a vertical symmetrical direction. The light blocking opening $O_T$ may be formed to expose the growth substrate 101 in the second region II and may be arranged to surround the mesa region to effectively block light.

Figure 2F:
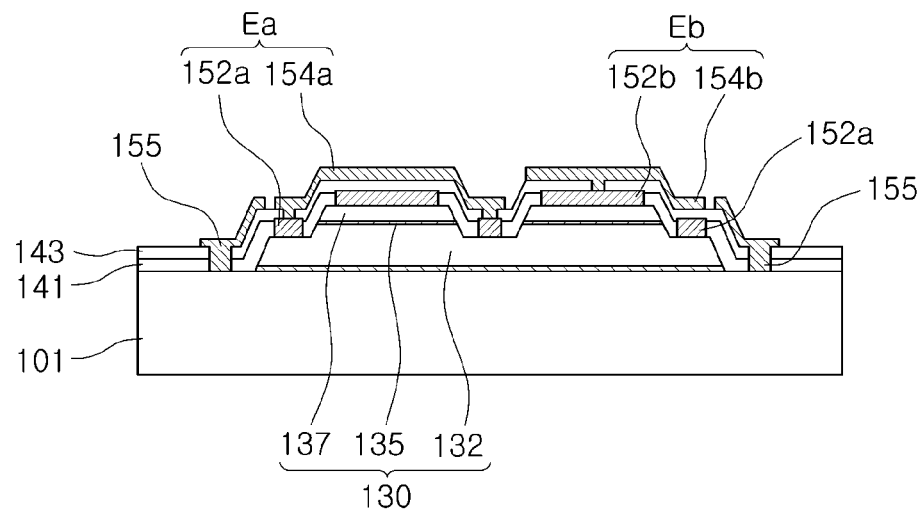
Figure 3E:
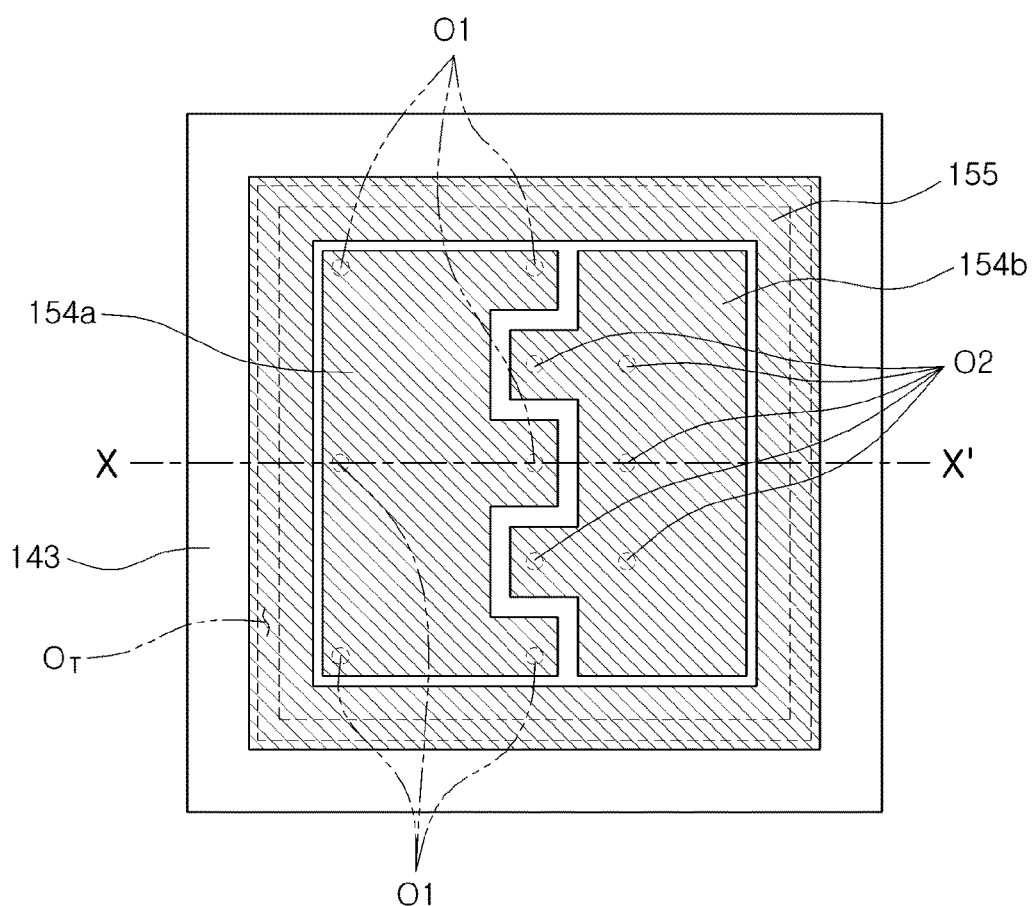

Subsequently, as illustrated in FIGS. 2F and 3E, first and second connection electrode layers 154a and 154b connected to the first and second ohmic contact layers 152a and 152b through the first and second openings O1 and O2, respectively, may be formed. A light blocking film 155 may extend from the light blocking opening $O_T$ along a surface of the second insulating layer 143, to surround or encompass the semiconductor stack 130.

A process of forming the light blocking film 155 may be undertaken simultaneously or contemporaneously with a connection electrode forming process. In this case, the light blocking film 155 may be formed of or include the same metal as the first and second connection electrode layers 154a and 154b. The light blocking film 155 may be formed to be connected to the growth substrate 101 through the light blocking opening $O_T$. The first connection electrode layer 154a and the first ohmic contact layer 152a may be provided as the first electrode Ea, and the second connection electrode layer 154b and the second ohmic contact layer 152b may be provided as the second electrode Eb.

As illustrated in FIG. 3E, the first and second connection electrode layers 154a and 154b may be respectively disposed on both sides of the device to cover the first and second openings O1 and O2 according to the arrangement of the first and second openings O1 and O2. The light blocking film 155 may be formed to be connected to the growth substrate 101 through the light blocking opening $O_T$. The light blocking film 155 may be formed to surround the semiconductor stack 130.

Figure 2G:
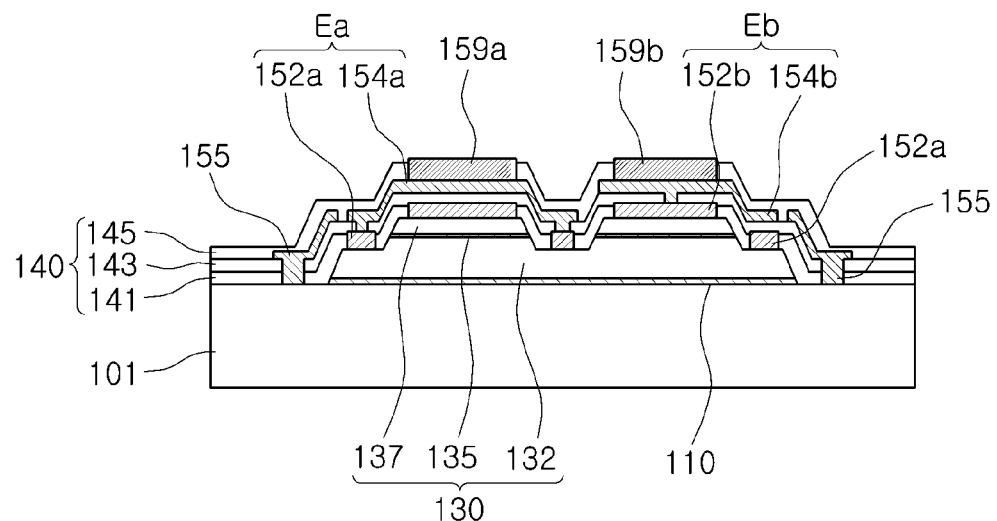
Figure 3F:
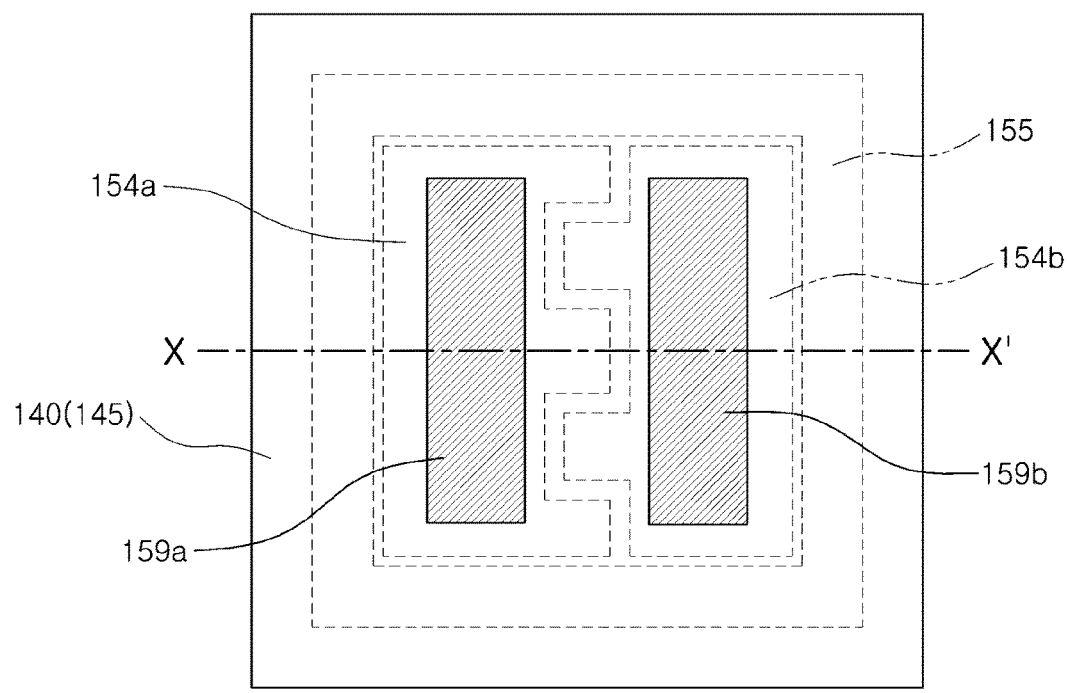

Subsequently, first and second electrode pads 159a and 159b may be formed on a portion of the first electrode Ea and a portion of the second electrode Eb, respectively, as illustrated in FIGS. 2G and 3F.

As illustrated in FIG. 3F, the first electrode pad 159a may be disposed on the first electrode Ea located on a left mesa region, for example, on a portion of the first connection electrode layer 154a. The second electrode pad 159b may be disposed on the second electrode Eb located on a right mesa region, for example, on a portion of the second connection electrode layer 154b. The first and second electrode pads 159a and 159b may include an under bump metallization (UBM) layer. For example, the first and second electrode pads 159a and 159b may be respectively configured of a multilayer film in which a titanium (Ti) film is formed and a nickel (Ni) film is disposed on the Ti film. A copper (Cu) film may be used instead of the Ni film. In another example, the first and second electrode pads 159a and 159b may be respectively configured of a multilayer film of a CrNi film or a Cr/Cu layer. The third insulating layer 145 may be formed as a passivation layer, to cover regions except for the first and second electrode pads 159a and 159b.

FIGS. 4A to 4D are cross-sectional views illustrating portions of main processes in a method of manufacturing a semiconductor light emitting device according to an example embodiment. In the processes, the growth substrate of the semiconductor light emitting device described above in the foregoing example embodiment may be replaced with a light-transmissive support including a wavelength conversion material.

Figure 4A:
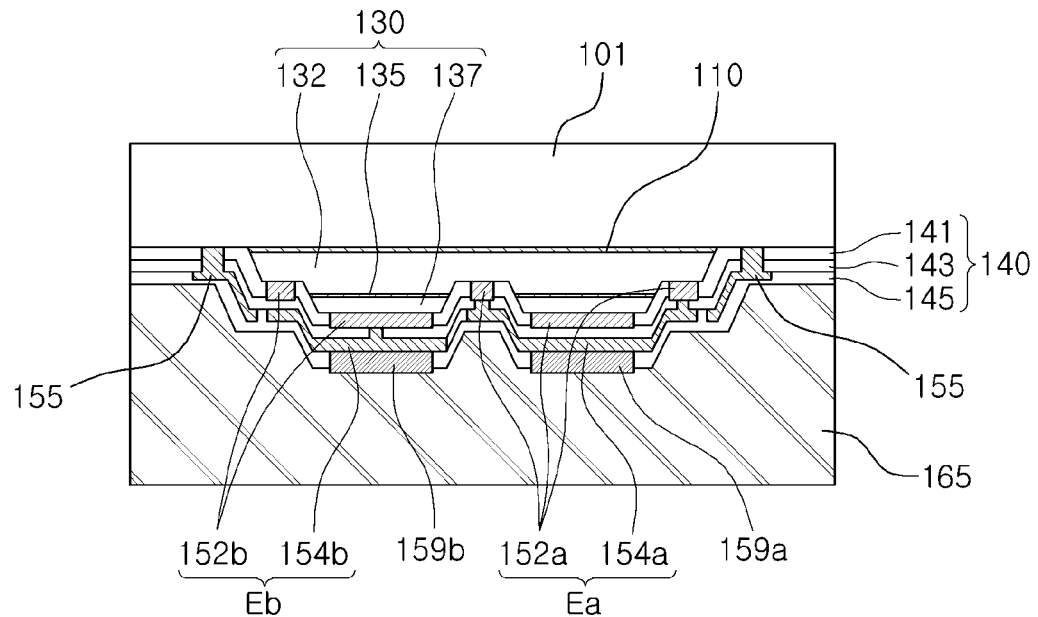
FIGS. 4A to 4D are cross-sectional views illustrating example processes in a method of manufacturing a semiconductor light emitting device, for example, forming a wavelength conversion structure, according to an example embodiment.

Referring to FIG. 4A, a temporary support 165 may be provided on a surface of a semiconductor stack 130 on which first and second electrodes Ea and Eb are be formed.

The temporary support 165 refers to a temporary support structure to process the semiconductor stack 130 in a subsequent process of providing a light-transmissive support. The temporary support 165 may include a temporary substrate and a temporary bonding layer allowing for bonding of the temporary substrate thereto. For example, the temporary substrate may be a quartz substrate, and the temporary bonding layer may be a variety of energy-curable resins such as an ultraviolet curable resin. In addition, the temporary support 165 may be formed of or include a material that may be easily removed or cleaned in a subsequent process.

Figure 4B:
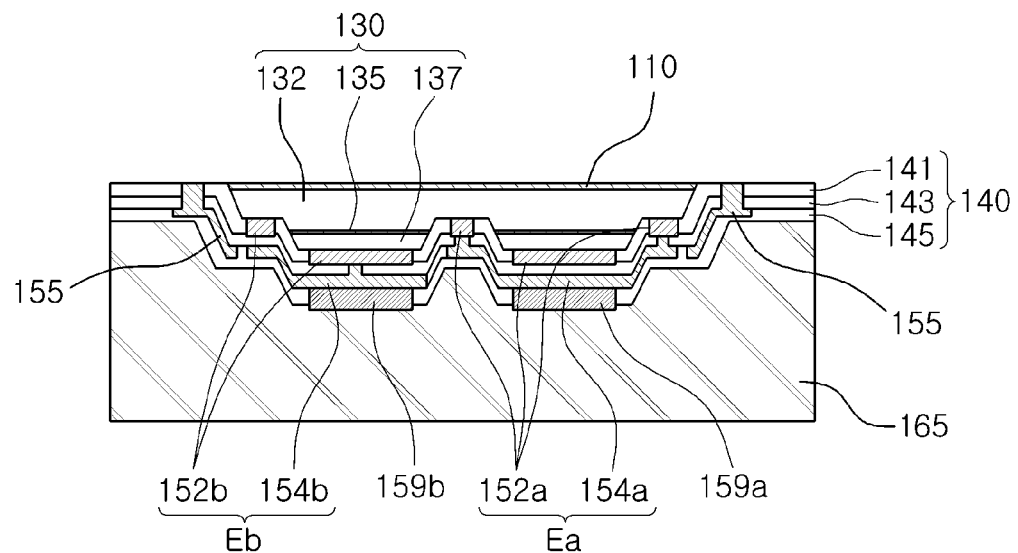

Referring to FIG. 4B, a growth substrate 101 may be removed from the semiconductor stack 130.

Removal of the growth substrate 101 may be performed by various processes such as laser lift-off, mechanical polishing or chemical-mechanical polishing, or chemical etching. For example, when a silicon substrate is used, since mechanical strength thereof is relatively low, the growth substrate 101 may be removed using a mechanical or chemical-mechanical polishing process. The example embodiment illustrates a manner in which the buffer layer 110 remains by way of example, but is not limited thereto. In another example embodiment, at least a portion of the buffer layer 110 may be removed, together with the removal of the growth substrate 101.

Figure 4C:
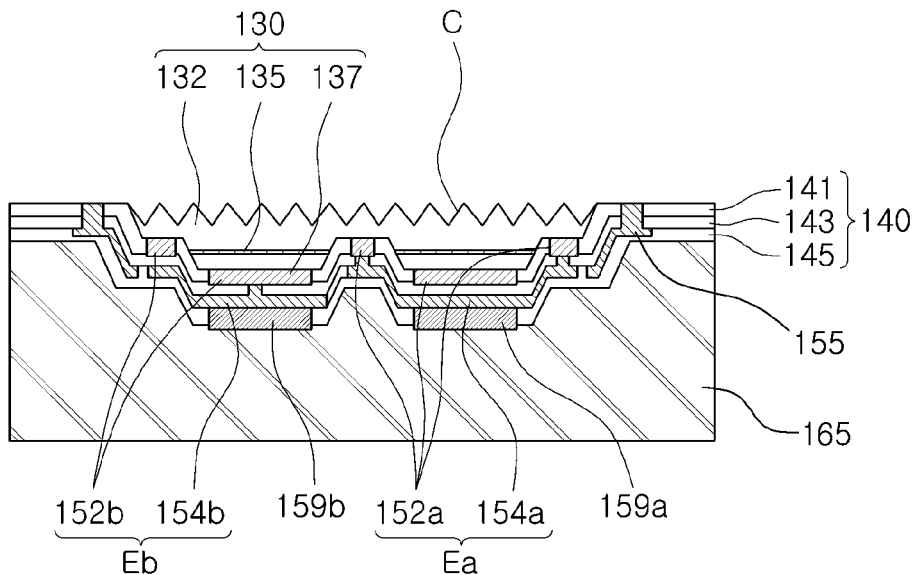

Subsequently, as illustrated in FIG. 4C, concave-convex portions C may be formed on a surface of the semiconductor stack 130 from which the growth substrate 101 has been removed.

The concave-convex portions C for improvement of light extraction may be directly formed on a surface of the semiconductor stack, in detail, a surface of the first conductivity-type semiconductor layer or the buffer layer. A process of forming concave-convex portions may be performed by dry etching using a photoresist pattern. A portion of the first conductivity-type semiconductor layer 132 as well as remaining buffer layer 110 may be removed together in the process of forming the concave-convex portions C. In another example, a portion of the concave-convex portions C may be formed as the buffer layer 110 by reducing an amount of a removed thickness.

Figure 4D:
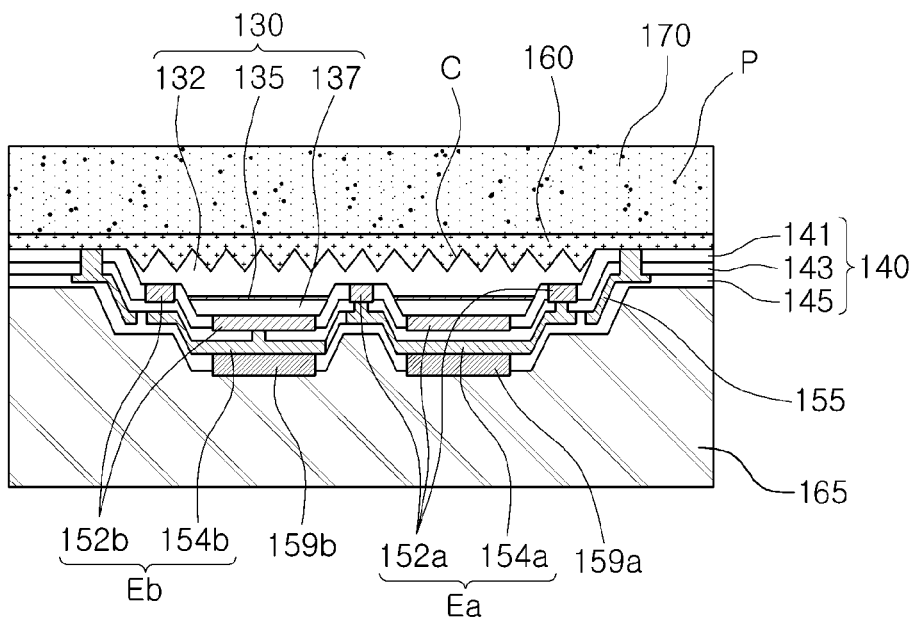

Subsequently, as illustrated in FIG. 4D, a light-transmissive support 170 may be bonded to a surface of the semiconductor stack 130 on which the concave-convex portions C are formed, using the light-transmitting bonding layer 160.

The light-transmissive support 170 may be a permanent support substrate replacing the growth substrate and the temporary support. Since the light-transmissive support 170 is provided as a main path through which light may be emitted, the light-transmissive support 170 may be formed of or include a light-transmitting material and may include a wavelength conversion material. For example, the light-transmissive support 170 may be a glass substrate containing a wavelength conversion material or may be a ceramic substrate formed of or include a phosphor. The light-transmitting bonding layer 160 may include a bonding material having light transmission characteristics. As described above, the light-transmitting bonding layer 160 may also include a wavelength conversion material P converting a wavelength of light emitted from an active layer 135.

In addition, the temporary support 165 may be removed from the semiconductor stack 130. In this case, the semiconductor light emitting device illustrated in FIG. 1A may be provided by removing the temporary support 165 and by performing a cleaning process.

Figure 5:
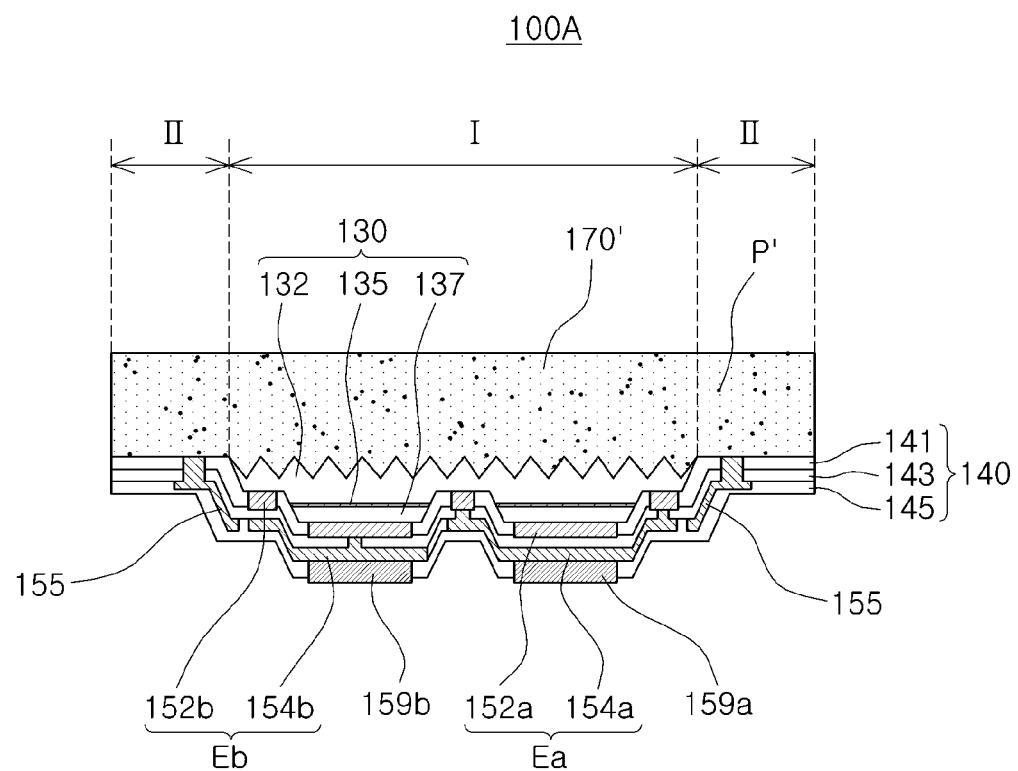
FIG. 5 is a cross-sectional view of a semiconductor light emitting device, according to an example embodiment.

FIG. 5 is a cross-sectional view of a semiconductor light emitting device according to an example embodiment.

With reference to FIG. 5, a semiconductor light emitting device 100A according to an example embodiment may be understood as being similar to or the same as the semiconductor light emitting device of the example embodiment described above with reference to FIG. 1A, except that a light-transmissive support 170' including a wavelength conversion material P is directly bonded to a semiconductor stack 130.

The light-transmissive support 170' may be formed of or include a bonding material including the wavelength conversion material P. The bonding material of the light-transmissive support 170' may be a spin-on glass.

FIGS. 6A to 6D are cross-sectional views illustrating various examples of structures of a buffer layer and a stress compensation layer, according to example embodiments. The semiconductor light emitting device according to an example embodiment may be manufactured using a stress compensation layer in addition to the buffer layer 110 illustrated in FIG. 2A.

Figure 6A:
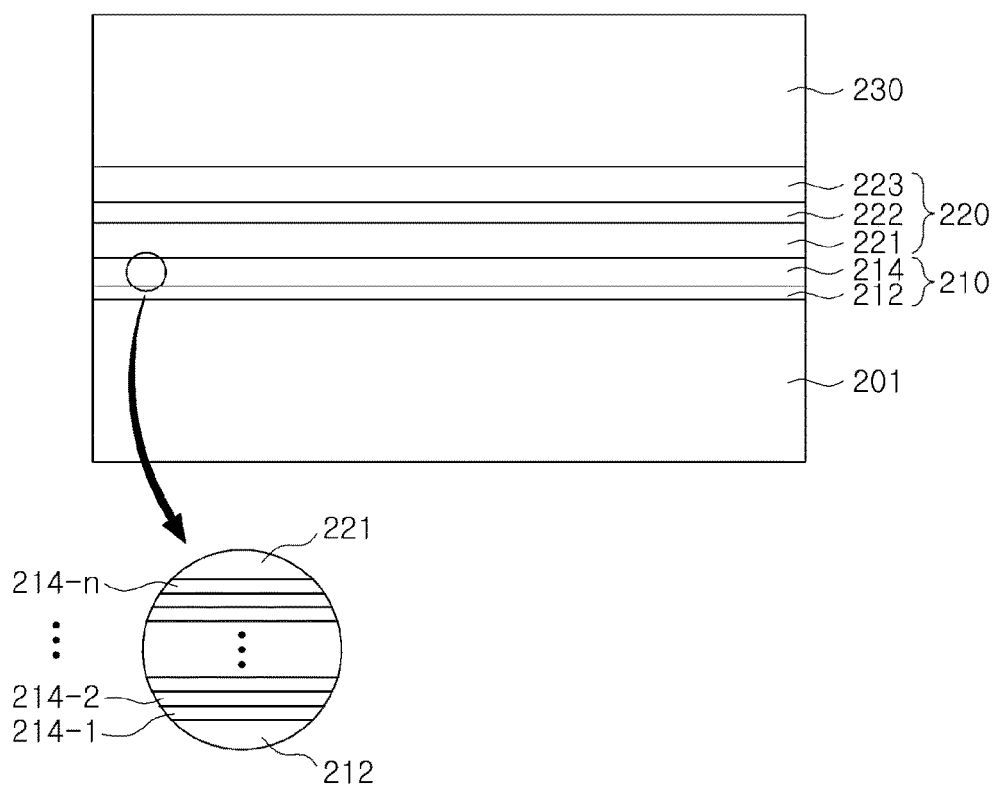
FIGS. 6A to 6D are cross-sectional views illustrating various examples of a composite buffer layer according to example embodiments.

As illustrated in FIG. 6A, a buffer layer 210, a stress compensation layer 220, and a nitride stack 230 may be arranged, for example sequentially arranged on a silicon substrate 201.

Examples of the silicon substrate 201 may include a substrate partially including a silicon material, as well as a substrate formed only of a silicon material. For example, a silicon-on-insulator (SOI) substrate may also be used as the silicon substrate 201. An upper surface of the silicon substrate 201 may be a (111) surface. The buffer layer 210 may include a nucleation layer 212 disposed on the silicon substrate 201 and a lattice buffer layer 214 disposed on the nucleation layer 212.

The nucleation layer 212 may be an AlN layer. The lattice buffer layer 214 may allow for a reduction in defects by bending threading dislocations. As a thickness of the lattice buffer layer 214 increases, compressive stress relaxation of a first nitride semiconductor layer 221, to be grown subsequently, may be reduced, and defects may also be reduced. The thickness of the lattice buffer layer 214 may be in a range of several hundred nanometers to several micrometers.

Although the lattice buffer layer 214 may have a single composition, the lattice buffer layer 214 may be a graded layer of $Al_xIn_yGa_{1-x-y}N$ (0≤x, y≤1, x+y≤1). A graded structure according to the example embodiment may include a plurality of layers 214-1, 214-2, . . . 214-n, and the plurality of layers 214-1, 214-2, . . . 214-n may have a step-graded structure in which a composition of aluminum (Al) is reduced, for example sequentially reduced. In a detailed example, the lattice buffer layer 214 having a graded structure may be implemented by ternary AlGaN in which an Al composition may be controlled. In another example, the lattice buffer layer may have a linearly graded structure rather than a step-graded structure.

In the case of the lattice buffer layer 214, a lattice mismatch between the nucleation layer 212 and the first nitride semiconductor layer 221 may be reduced in a stepwise manner. In detail, since the lattice buffer layer 214 may effectively generate compressive stress during crystal growth, tensile stress occurring during cooling may be reduced.

The stress compensation layer 220 may include the first nitride semiconductor layer 221, an intermediate layer 222 and a second nitride semiconductor layer 223 disposed, for example sequentially disposed on the lattice buffer layer 214.

The first nitride semiconductor layer 221 may be a nitride crystal layer having a lattice constant greater than the lattice constant of the lattice buffer layer 214. The first nitride semiconductor layer 221 may include $Al_xIn_yGa_{1-x-y}N$ (0≤x, y≤1, x+y<1), and for example, may be a GaN layer. The first nitride semiconductor layer 221 may receive compressive stress applied thereto at an interface thereof with the lattice buffer layer 214.

The compressive stress may be alleviated as a thickness of the first nitride semiconductor layer 221 may be increased. When the thickness of the first nitride semiconductor layer 221 is increased to, for example, about 2 μm or more, may be increased, a difference in thermal expansion coefficient between the silicon substrate 201 and the first nitride semiconductor layer 221 It may be difficult to control the tensile stress caused by the cracks, and even cracks may occur.

The intermediate layer 222 may be disposed on the first nitride semiconductor layer 221 to compensate for tensile stress occurring during cooling. The intermediate layer 222 may be a nitride crystal layer having a lattice constant that is lower than the lattice constant of the first nitride semiconductor layer 221. For example, the intermediate layer 222 may be an $Al_xGa_{1-x}N$ (0.4<x<1) layer.

The second nitride semiconductor layer 223 may be disposed on the intermediate layer 222. The second nitride semiconductor layer 223 may have compressive stress. The compressive stress of the second nitride semiconductor layer 223 may compensate for relatively low compressive stress or tensile stress received by the first nitride semiconductor layer 221 to thus suppress occurrence of cracks. The second nitride semiconductor layer 223 may include $Al_xIn_yGa_{1-x-y}N$ (0≤x, y≤1, x+y<1) similarly to or the same as the first nitride semiconductor layer 221. For example, the second nitride semiconductor layer 223 may be a GaN layer. At least one of the first and second nitride semiconductor layers 221 and 223 may be an undoped nitride layer, but is not limited thereto. The nitride stack 230 may correspond to the semiconductor stack 130 illustrated in the foregoing example embodiment.

Figure 6B:
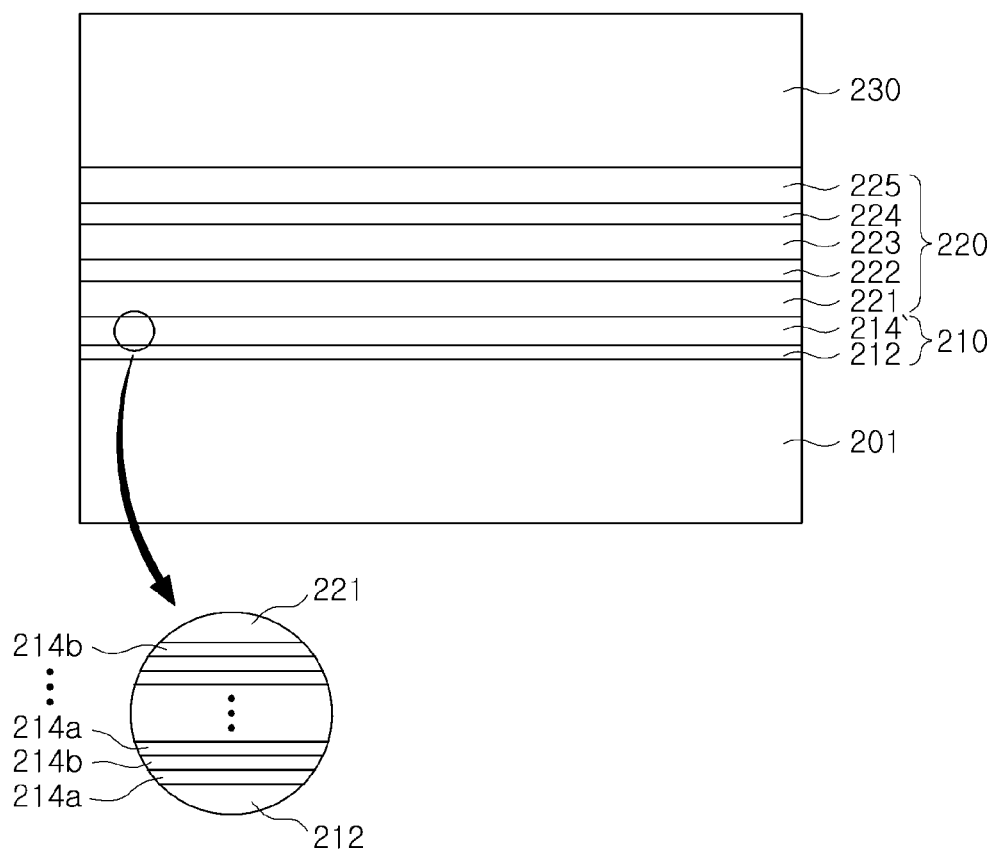

Referring to FIG. 6B, a buffer layer 210, a stress compensation layer 220, and a nitride stack 230 may be arranged, for example sequentially arranged on a silicon substrate 201, in a manner similar to or the same as FIG. 6A. Components indicated by the same reference numerals as those in FIG. 6A may be referred to the description of FIG. 6A unless otherwise described.

The buffer layer 210 may include an AlN nucleation layer 212 and a lattice buffer layer 214', similar to or the same as the buffer layer 210 illustrated in FIG. 6A, while the lattice buffer layer 214' in the example embodiment may have a different structure from that of the lattice buffer layer 214 illustrated in FIG. 4.

The lattice buffer layer 214' may have a superlattice structure in which two or more layers 214a and 214b having different compositions are stacked, for example alternately stacked. For example, the lattice buffer layer 214' may be a superlattice layer of $Al_xIn_y Ga_{1-x1-y1}N/Al_{x2}In_{y2}Ga_{1-x2-y2}N$ (0≤x1, x2, y1, y2≤1, x1≠x2 or y1≠y2, x1+y1≤1, x2+y2≤1). As in the example embodiment, the lattice buffer layer 214' employing the superlattice structure therein may also effectively alleviate stress between the silicon substrate 201 and a first nitride semiconductor layer 221.

The stress compensation layer 220 according to the example embodiment may further include a second intermediate layer 224 and a third nitride semiconductor layer 225, in addition to the first and second nitride semiconductor layers 221 and 223 and a first intermediate layer 222 disposed therebetween, as described above with reference to FIG. 6A.

The second intermediate layer 224 and the third nitride semiconductor layer 225 may be understood as layers being similar to or the same as those of the first intermediate layer 222 and the second nitride semiconductor layer 223. For example, the second intermediate layer 224 may be disposed on the second nitride semiconductor layer 223 to compensate for tensile stress generated during cooling. The second intermediate layer 224 may be formed of or include a nitride crystal having a lattice constant that is lower than the lattice constant of the second nitride semiconductor layer 223. For example, the second intermediate layer 224 may be an $Al_xGa_{1-x}N$ (0.4<x<1) layer, similarly to the first intermediate layer 222.

The third nitride semiconductor layer 225 may be disposed on the second intermediate layer 224. The third nitride semiconductor layer 225 may have compressive stress, and the compressive stress of the third nitride semiconductor layer 225 may compensate for relatively low compressive stress or tensile stress received by the first and second nitride semiconductor layers 221 and 223 disposed below the third nitride semiconductor layer 225, thereby suppressing the occurrence of cracks.

The third nitride semiconductor layer 225 may include $Al_xIn_yGa_{1-x-y}N$ (0≤x, y≤1, x+y<1), similarly to the second nitride semiconductor layer 223. For example, the third nitride semiconductor layer 225 may be a GaN layer.

Figure 6C:
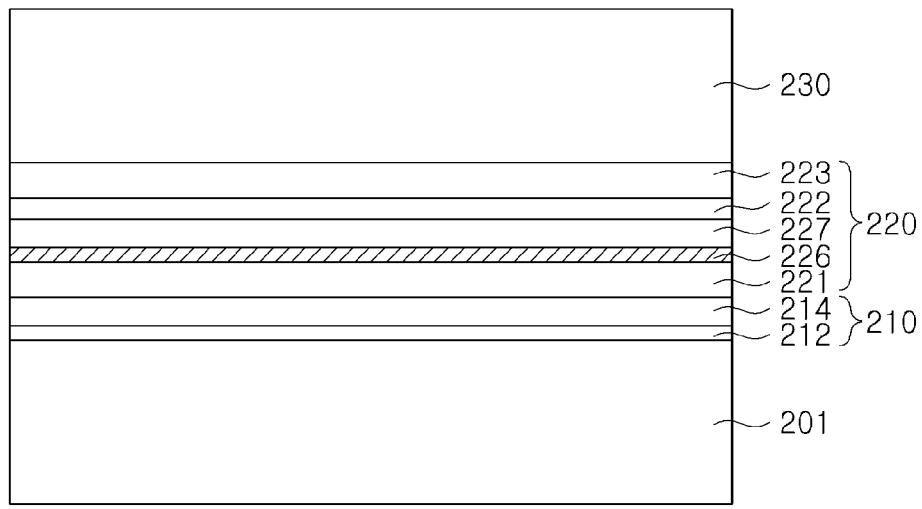

Referring to FIG. 6C, a buffer layer 210, a stress compensation layer 220, and a nitride stack 230 may be arranged, for example sequentially arranged on a silicon substrate 201, similar to or the same as FIG. 6A, while a mask layer 226 and a coalesced nitride layer 227 formed on the mask layer 226 may be provided, differently from the illustration of FIG. 6A. The mask layer 226 may be disposed on a first nitride semiconductor layer 221.

Most of threading dislocations from the first nitride semiconductor layer 221 may be blocked by the mask layer 226, and remaining threading dislocations may also be bent by the coalesced nitride layer 227 grown subsequently. As a result, a defect density of a subsequently grown nitride crystal may be significantly improved. A thickness and defect density of the coalesced nitride layer 227 may be changed, depending on variables such as growth conditions, for example, temperature, pressure, and a molar composition ratio of a group III-V source.

The mask layer 226 may be formed of or include silicon nitride $SiN_x$ or titanium nitride TiN. For example, a $SiN_x$ mask layer may be formed using silane $SiH_4$ and ammonia gas. The mask layer 226 may not completely cover a surface of the first nitride semiconductor layer 221. Thus, an exposed region of the first nitride semiconductor layer 221 may be determined according to an extent to which the mask layer 226 covers the first nitride semiconductor layer 221, and thus, an initial island growth pattern of a nitride crystal grown thereon may be changed. For example, when an exposed area of the nitride semiconductor layer is reduced by increasing a mask area of $SiN_x$, a density of the initial island of the coalesced nitride layer 227 to be grown on the mask layer 226 may decrease, while a size of the integrated island may be relatively increased. Thus, a thickness of the coalesced nitride layer 227 may also be increased.

For example, when the mask layer 226 is added, stress between nitride semiconductor layers may be decoupled by the mask layer, and compressive stress transferred to the coalesced nitride layer 227 may be partially blocked. In addition, relative tensile stress may be generated in the coalesced nitride layer 227 in a process in which growing islands are coalesced. As a result, the first nitride semiconductor layer 221 may receive a relatively high level of compressive stress from the buffer layer 210, while the coalesced nitride layer 227, coalesced on the mask layer 226, may receive a relatively low level of compressive stress or tensile stress from decoupling stress and island coalescence. If a thickness of the layer having such a relatively low compressive stress exceeds a critical point, since cracks may occur in a thin film during cooling, a thickness of the coalesced nitride layer 227 may be selected in conditions in which cracks may not occur and a defect density may also be reduced.

Figure 6D:
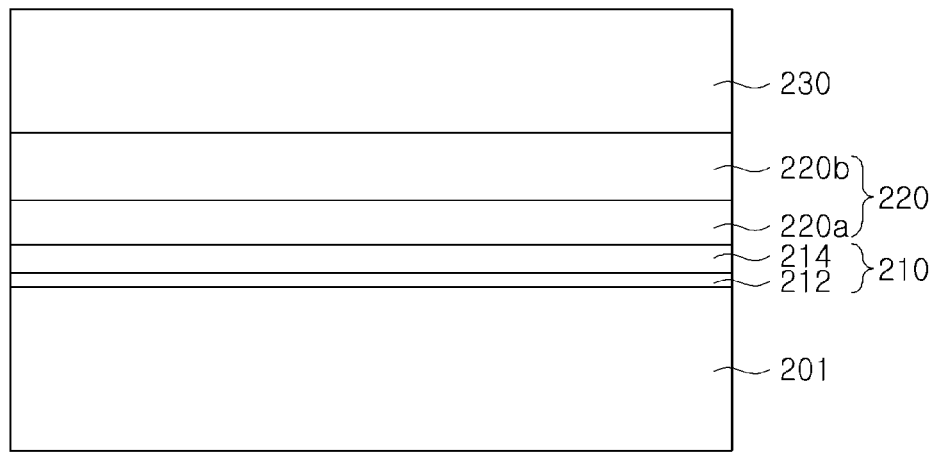

Referring to FIG. 6D, a buffer layer 210, a stress compensation layer 220, and a nitride stack 230 may be arranged, for example sequentially arranged on a silicon substrate 201.

The stress compensation layer 220 according to the example embodiment may include first and second nitride semiconductor layers 220a and 220b formed under different growth conditions. The first nitride semiconductor layer 220a may be grown in a two-dimensional mode to control an increase rate of surface roughness, thereby reducing the occurrence of a twisted grain boundary at an interface between the first nitride semiconductor layer 220a and the second nitride semiconductor layer 220b.

The first nitride semiconductor layer 220a may be formed under a first growth condition, to have a surface roughness in which an illuminance ratio with respect to a surface roughness of the buffer layer 210 is 3 or less. The second nitride semiconductor layer 220b may be formed on the nitride semiconductor layer 220a in a second growth condition. In this case, at least one of temperature, pressure, and a group III-V molar ratio in the second growth condition may be different from that in the first growth condition, to increase a three-dimensional growth mode compared to the first growth condition. The first nitride semiconductor layer 220a may have a thickness ranging from 2 nm to 1000 nm. As the thickness of the first nitride semiconductor layer 220a increases, the generation of a twisted grain boundary at an interface between the first and second nitride semiconductor layers 220a and 220b may be reduced. However, in the case in which the thickness of the first nitride semiconductor layer 220a is increased, crystalline characteristics of the entirety of a thin film may be deteriorated. For example, since the first nitride semiconductor layer 220a is grown at a relatively low temperature compared to a nitride layer, defects may occur. Thus, it may be advantageous to reduce the occurrence of a twisted grain boundary while reducing the thickness of the first nitride semiconductor layer 220a.

For example, when the occurrence of a twisted grain boundary is reduced, a defect of the second nitride semiconductor layer 220b stacked on the first nitride semiconductor layer 220a may be reduced. For example, as the first nitride semiconductor layer 220a has a roughness ratio of 3 or less, compared to a roughness ratio of the buffer layer, while having a thickness range of 2 nm to 1000 nm, a defect of the second nitride semiconductor layer 220b stacked on the first nitride semiconductor layer 220a may be reduced. Thus, since the same extent of crystalline characteristics may be obtained at a relatively low thickness, the entire structure may be miniaturized, and for example, even when a mask layer is not used, a thickness of entirety of the buffer layer 210 and the stress compensation layer 220 may be 6 µm or less. Thus, a process time and cost in crystal growth may be reduced.

The second nitride semiconductor layer 220b may be formed of or include $Al_xIn_yGa_{1-x-y}N$ (0≤x, y≤1, x+y<1). The second nitride semiconductor layer 220b may be continuously grown on the first nitride semiconductor layer 220a without further growth of a layer having a different composition thereon. The second nitride semiconductor layer 220b may have the same composition as the first nitride semiconductor layer 220a. For example, the first and second nitride semiconductor layers 220a and 220b may be GaN layers. In a specific example, the first nitride semiconductor layer 220a may be an undoped GaN layer, and the second nitride semiconductor layer 220b may be an n-type GaN layer.

Figure 7:
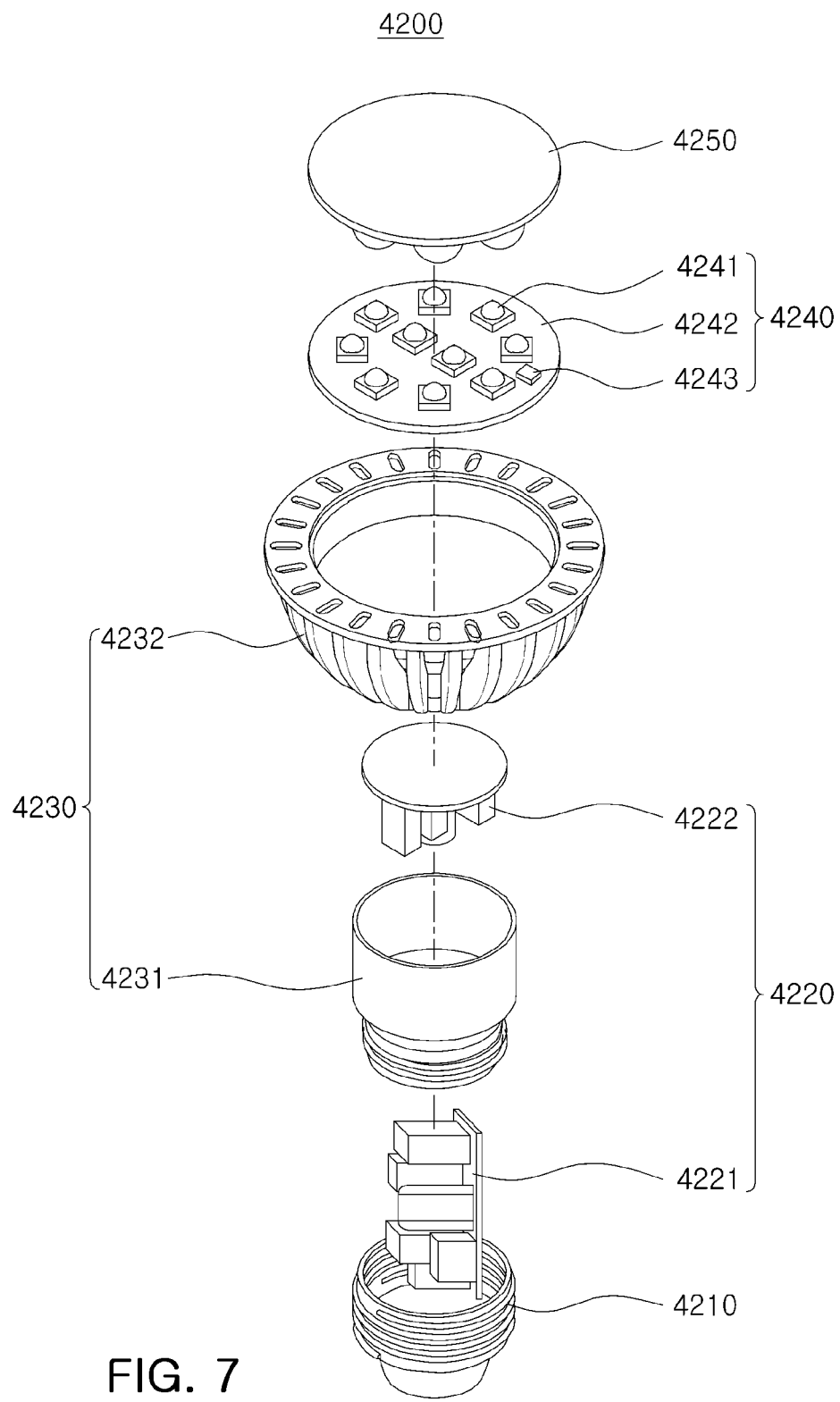
FIG. 7 is a schematic exploded perspective view illustrating a lighting device including a semiconductor light emitting device, according to an example embodiment.

FIG. 7 is a schematic exploded perspective view illustrating a lighting device including a semiconductor light emitting device according to an example embodiment.

A lighting device 4200 according to an example embodiment may include a screw base 4210, a power supply unit 4220, a heat dissipation unit 4230, a light source module 4240, and an optical unit 4250. According to an example embodiment, the light source module 4240 may include a light emitting device array, and the power supply unit 4220 may include a light emitting device driver.

The screw base 4210 may be configured to allow the lighting device to be replaceable with an existing lighting device. Power supplied to the lighting device 4200 may be applied through the screw base 4210 thereto. As illustrated in FIG. 7, the power supply unit 4220 may include a first power supply portion 4221 and a second power supply portion 4222 that are separated from or coupled to each other. The heat dissipation unit 4230 may include an internal heat sink 4231 and an external heat sink 4232. The internal heat sink 4231 may be directly connected to the light source module 4240 and/or the power supply unit 4220, by which heat may be transferred to the external heat sink 4232. The optical unit 4250 may include an internal optical portion (not shown) and an external optical portion (not shown), and may be configured in such a manner that light emitted from the light source module 4240 may be evenly distributed.

The light source module 4240 may receive power from the power supply unit 4220 to emit light to the optical unit 4250. The light source module 4240 may include one or more semiconductor light emitting devices 4241, a circuit board 4242, and a controller 4243, and the controller 4243 may store information regarding driving of the light emitting devices 4241 therein. The semiconductor light emitting devices 4241 may include the semiconductor light emitting device 100 or 100A according to the example embodiments.

As set forth above, according to an example embodiment, a desired wavelength conversion structure may be provided using a simple process by introducing a wavelength conversion material into a light-transmissive support and/or a bonding member. Further, by forming a light blocking film surrounding a semiconductor stack, light leakage may be reduced or prevented and light may be efficiently extracted via a wavelength conversion structure. Thus, light efficiency of a semiconductor light emitting device may be improved.

While example embodiments have been shown and described above, it will be apparent to those skilled in the art that modifications and variations could be made without departing from the scope of the inventive concepts as defined by the appended claims.

What is claimed is:

1. A semiconductor light emitting device comprising:
a light-transmissive support having a first surface including a first region and a second region surrounding the first region, and a second surface opposing the first surface, the light-transmissive support including a wavelength conversion material;
a semiconductor stack on the first region of the first surface of the light-transmissive support, and including a first conductivity-type semiconductor layer, a second conductivity-type semiconductor layer, and an active layer between the first and second conductivity-type semiconductor layers;
a light-transmitting bonding layer between the light-transmissive support and the semiconductor stack;
a light blocking film on the second region of the light-transmissive support and surrounding the semiconductor stack;
a first electrode and a second electrode respectively on a portion of the first conductivity-type semiconductor layer and a portion of the second conductivity-type semiconductor layer;
an insulating layer covering the semiconductor stack to have first and second openings defining the portions of the first and second conductivity-type semiconductor layers, respectively, and extending above the second region of the light-transmissive support; wherein:
the insulating layer has a third opening on the second region of the light-transmissive support and surrounding the semiconductor stack;
the light blocking film extends from the third opening of the insulating layer along a surface of the insulating layer; and
the light blocking film is in contact with the light-transmitting bonding layer through the third opening.

2. The semiconductor light emitting device of claim 1, wherein the light-transmissive support comprises a glass substrate including the wavelength conversion material.

3. The semiconductor light emitting device of claim 1, wherein the light-transmissive support comprises a ceramic substrate including a phosphor.

4. The semiconductor light emitting device of claim 1, wherein the light blocking film comprises a same material as a material of a portion of the first and second electrodes.

5. The semiconductor light emitting device of claim 1, wherein the wavelength conversion material of the light-transmissive support is a first wavelength conversion material configured to convert a portion of light generated in the active layer into light of a first wavelength, and the light-transmitting bonding layer includes a second wavelength conversion material configured to convert a portion of light generated in the active layer into light of a second wavelength, the second wavelength being different from the first wavelength.

6. The semiconductor light emitting device of claim 1, wherein the light-transmitting bonding layer comprises spin-on-glass.

7. The semiconductor light emitting device of claim 1, wherein the semiconductor stack comprises a concave-convex portion on a surface of the semiconductor stack contacting the light-transmitting bonding layer.

8. A semiconductor light emitting device comprising:
   a light-transmissive support having a first surface including a first region and a second region surrounding the first region, and a second surface opposing the first surface, the light-transmissive support including a bonding material containing a wavelength conversion material;
   a semiconductor stack bonded to the first region of the first surface of the light-transmissive support, and including a first conductivity-type semiconductor layer, a second conductivity-type semiconductor layer, and an active layer between the first and second conductivity-type semiconductor layers;
   a light blocking film on the second region of the light-transmissive support and surrounding the semiconductor stack; and
   a first electrode and a second electrode respectively on a portion of the first conductivity-type semiconductor layer and a portion of the second conductivity-type semiconductor layer.

9. The semiconductor light emitting device of claim 8, wherein the bonding material of the light-transmissive support comprises spin-on glass.

10. The semiconductor light emitting device of claim 8, further comprising an insulating layer covering the semiconductor stack and extending on the second region of the light-transmissive support, and having an opening on the second region of the light-transmissive support surrounding the semiconductor stack,
   wherein the light blocking film extends from an opening of the insulating layer along a surface of the insulating layer.

11. The semiconductor light emitting device of claim 10, wherein the light blocking film is in contact with the light-transmissive support through the opening.

12. The semiconductor light emitting device of claim 8, wherein the first electrode and the second electrode include a plurality of electrode layers, and the light blocking film includes a same material as a material of at least one of the plurality of electrode layers.

13. A semiconductor light emitting device comprising:
   a light-transmissive substrate including a wavelength conversion material;
   a semiconductor stack on the light-transmissive substrate and including a first conductivity-type semiconductor layer, a second conductivity-type semiconductor layer, and an active layer between the first and second conductivity-type semiconductor layers;
   a light-transmitting bonding layer configured to bond the light-transmissive substrate with the semiconductor stack;
   a light blocking film on the light-transmissive substrate and encompassing the semiconductor stacks;
   a first electrode and a second electrode respectively on a portion of the first conductivity-type semiconductor layer and a portion of the second conductivity-type semiconductor layer; and
   an insulating layer covering the semiconductor stack to have first and second openings defining the portions of the first and second conductivity-type semiconductor layers, respectively, and extending above the light-transmissive substrate;
   wherein:
   the insulating layer has a third opening on the light-transmissive substrate and surrounding the semiconductor stack;
   the light blocking film extends from the third opening of the insulating layer along a surface of the insulating layer; and
   the light blocking film includes a same material as a material of a portion of the first and second electrodes.

14. The semiconductor light emitting device of claim 13, wherein the light-transmissive substrate has a first surface including a first region and a second region surrounding the first region, and a second surface opposing the first surface.

15. The semiconductor light emitting device of claim 13, wherein the wavelength conversion material comprises phosphor.

* * * * *